United States Patent
Terauchi et al.

(10) Patent No.: US 9,490,412 B2
(45) Date of Patent: Nov. 8, 2016

(54) PELTIER MODULE FOR LASER DIODE

(71) Applicant: KELK Ltd., Hiratsuka-shi, Kanagawa (JP)

(72) Inventors: Kousuke Terauchi, Hiratsuka (JP); Masataka Yamanashi, Hiratsuka (JP); Hideyuki Ishikawa, Hiratsuka (JP); Akio Konishi, Hiratsuka (JP)

(73) Assignee: KELK Ltd., Hiratsuka-shi, Kanagawa (JP)

( * ) Notice: Subject to any disclaimer, the term of this patent is extended or adjusted under 35 U.S.C. 154(b) by 0 days.

(21) Appl. No.: 14/427,475

(22) PCT Filed: Sep. 12, 2013

(86) PCT No.: PCT/JP2013/074703
§ 371 (c)(1),
(2) Date: Mar. 11, 2015

(87) PCT Pub. No.: WO2014/042214
PCT Pub. Date: Mar. 20, 2014

(65) Prior Publication Data
US 2015/0221846 A1    Aug. 6, 2015

(30) Foreign Application Priority Data

Sep. 12, 2012    (JP) .................. 2012-200310

(51) Int. Cl.
- *H01L 35/28* (2006.01)
- *H01L 35/08* (2006.01)
- *H01S 5/024* (2006.01)
- *H01L 35/16* (2006.01)
- *H01L 35/32* (2006.01)

(52) U.S. Cl.
CPC .............. *H01L 35/08* (2013.01); *H01L 35/16* (2013.01); *H01L 35/32* (2013.01); *H01S 5/02415* (2013.01)

(58) Field of Classification Search
CPC ................ H01L 35/02–35/34; H01S 5/02415
USPC .................................................. 136/200–242
See application file for complete search history.

(56) References Cited

U.S. PATENT DOCUMENTS

| 4,855,810 A | 8/1989 | Gelb et al. |
| 2011/0023930 A1 | 2/2011 | Konig et al. |

FOREIGN PATENT DOCUMENTS

| CN | 1600495 A | 3/2005 |
| CN | 101952985 A | 1/2011 |
| JP | H06-286148 A | 10/1994 |
| JP | H08-168889 A | 7/1996 |
| JP | 2003-110154 A | 4/2003 |
| JP | 2003-197982 A | 7/2003 |
| JP | 2004-281930 A | 10/2004 |
| JP | 2004-296901 A | 10/2004 |
| JP | 2010-192764 A | 9/2010 |

*Primary Examiner* — Allison Bourke
*Assistant Examiner* — Niki Bakhtiari
(74) *Attorney, Agent, or Firm* — Drinker Biddle & Reath LLP

(57) ABSTRACT

A Peltier module for laser diode that can be mounted with high melting point solder is provided. A Peltier module for laser diode includes: a heat dissipation-side substrate; a heat dissipation-side electrode; a p-type thermoelectric conversion element and an n-type thermoelectric conversion element; a solder joint layer; and Ni-containing layers. The solder joint layer is disposed between the heat dissipation-side electrode and each of the p-type and n-type thermoelectric conversion elements, and includes Ni intermetallic compound containing Au and Sn, $Au_5Sn$ intermetallic compound, and a eutectic composition including $Au_5Sn$ intermetallic compound and AuSn intermetallic compound. The Ni-containing layer is disposed between the solder joint layer and the heat dissipation-side electrode and between the solder joint layer and each of the p-type and n-type thermoelectric conversion elements. The solder joint layer has a eutectic ratio of 15.1% or less.

7 Claims, 12 Drawing Sheets

PELTIER MODULE FOR LASER DIODE

TECHNICAL FIELD

The present invention relates to a Peltier module for laser diode, and particularly to a Peltier module for laser diode in which a thermoelectric conversion element is disposed on an electrode of a substrate with a solder joint layer interposed therebetween.

BACKGROUND ART

Since the oscillation wavelength of a laser diode used for an optical communication module or the like is influenced significantly by a temperature, the temperature of the laser diode needs to be controlled. In order to control the temperature of the laser diode, a Peltier module for laser diode is used.

For example, Japanese Patent Laying-Open No. 2003-197982 (PTD) discloses a Peltier device thermoelectric conversion module used for adjusting the temperature of a laser diode. In the Peltier device thermoelectric conversion module disclosed in this document, a thermoelectric semiconductor element and a land portion of a ceramic substrate are joined to each other with gold-tin eutectic composition solder.

CITATION LIST

Patent Document

PTD: Japanese Patent Laying-Open No. 2003-197982

SUMMARY OF INVENTION

Technical Problem

When a Peltier module for laser diode is mounted on an optical communication module, a substrate in the Peltier module for laser diode is soldered to a stem or the like of the optical communication module. In the Peltier device thermoelectric conversion module disclosed in the above-described document, when high melting point solder is used during this soldering, gold-tin eutectic composition solder that joins the thermoelectric semiconductor element and the land portion in the ceramic substrate may melt.

The present invention has been made in light of the above-described problems. An object of the present invention is to provide a Peltier module for laser diode that can be mounted using solder with a high melting point.

Solution to Problem

A Peltier module for laser diode according to the present invention includes: an insulation support substrate; an electrode; a thermoelectric conversion element; solder joint layers; and Ni (nickel)-containing layers. The electrode is formed on the substrate. The thermoelectric conversion element is electrically connected to the electrode and made of a BiTe (bismuth telluride)-based material. The solder joint layer is disposed between the electrode and the thermoelectric conversion element, and includes: Ni intermetallic compound containing Au and Sn; $Au_5Sn$ intermetallic compound; and eutectic composition including $Au_5Sn$ intermetallic compound and AuSn intermetallic compound. The Ni-containing layer is disposed each between the solder joint layer and the electrode and between the solder joint layer and the thermoelectric conversion element. The solder joint layer has a eutectic ratio of 15.1% or less.

According to the present invention, the Ni-containing layer is disposed between the solder joint layer and the electrode and also between the solder joint layer and the thermoelectric conversion element. Accordingly, when Ni-containing intermetallic compound is produced by Au and Sn in AuSn solder that has melted during joining, Sn is more consumed than Au during production of such intermetallic compound. As a result, since the proportion of Au in the solder joint layer is increased, $Au_5Sn$ intermetallic compound is produced in relatively large amount. Since this $Au_5Sn$ intermetallic compound is higher in melting point than the AuSn eutectic solder, it does not melt even at a temperature at which the AuSn eutectic solder melts. Therefore, the solder joint layer including a high proportion of $Au_5Sn$ intermetallic compound can be suppressed from melting even at an elevated temperature as compared with the case of the AuSn eutectic solder.

Furthermore, the present inventors have found that the eutectic ratio of the solder joint layer exerts an influence upon melting of the solder joint layer. Specifically, the present inventors have found that melting of the solder joint layer can be suppressed at a temperature of 320° C. when the eutectic ratio of the solder joint layer is 15.1% or less. Then, the present inventors have learned that the Peltier module for laser diode can be mounted at an elevated temperature since melting of the solder joint layer can be suppressed at a temperature of 320° C.

In the above-described Peltier module for laser diode, the eutectic ratio of the solder joint layer is preferably 10.1% or less. The present inventors have found that melting of the solder joint layer can be suppressed at a temperature of 350° C. when the eutectic ratio of the solder joint layer is 10.1% or less. Then, the present inventors have learned that the Peltier module for laser diode can be mounted at a further elevated temperature since melting of the solder joint layer can be suppressed at a temperature of 350° C.

In the above-described Peltier module for laser diode, the solder joint layer has shear strength of 1.5 $N/mm^2$ or more. The present inventors have found that melting of the solder joint layer can be suppressed when the shear strength of the solder joint layer is 1.5 $N/mm^2$ or more.

In the above-described Peltier module for laser diode, the solder joint layer contains Pd. Thereby, deterioration in wire bonding performance under a high temperature environment can be suppressed, so that the wire bonding performance can be improved.

The above-described Peltier module for laser diode further includes wire bonding pads (electrode) electrically connected to the electrode. Therefore, a Peltier module for laser diode including wire bonding pads (electrode) can be provided. Furthermore, it is preferable that Pd-containing layers are applied between Ni-containing layers and Au layers in the wire bonding pad portion. Thereby, diffusion of Ni under a high temperature environment can be prevented, so that deterioration in wire bonding performance can be suppressed.

The above-described Peltier module for laser diode further includes lead wires electrically connected to the electrode. Therefore, a Peltier module for laser diode including lead wires can be provided.

The above-described Peltier module for laser diode further includes metal posts electrically connected to the electrode. Therefore, a Peltier module for laser diode including metal posts can be provided.

Advantageous Effects of Invention

According to the present invention as described above, a Peltier module for laser diode that can be mounted with high melting point solder can be provided.

DESCRIPTION OF EMBODIMENTS

The embodiments of the present invention will be hereinafter described with reference to the accompanying drawings.

The configuration of a Peltier module for laser diode in one embodiment of the present invention will be first described.

Figure 1:
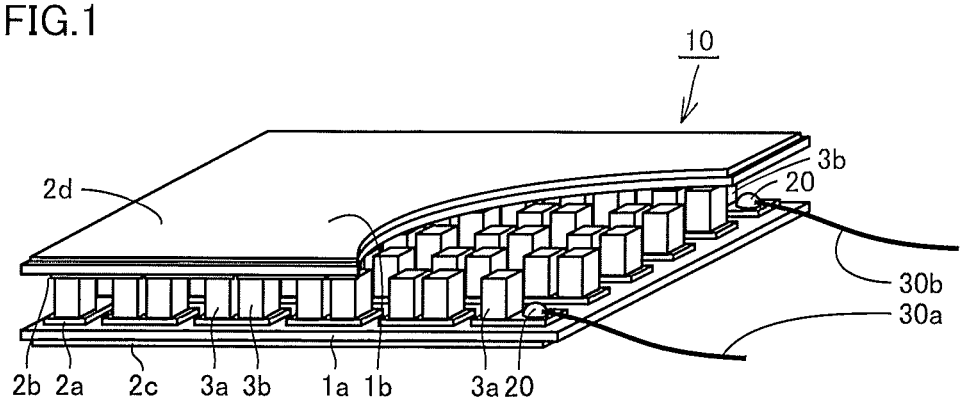
FIG. 1 is a perspective view schematically showing the configuration of a Peltier module for laser diode in one embodiment of the present invention.

Referring to FIG. 1, a Peltier module for laser diode 10 is configured such that a p-type thermoelectric conversion element 3a and an n-type thermoelectric conversion element 3b are joined so as to be electrically connected in series in an alternate manner between a heat dissipation-side substrate 1a and a cooling-side substrate 1b. Furthermore, Peltier module for laser diode 10 may also be configured such that these thermoelectric conversion elements are partially connected in parallel.

Heat dissipation-side substrate 1a and cooling-side substrate 1b each are made, for example, of $Al_2O_3$ (aluminum oxide), AlN (aluminum nitride), SiC (silicon carbide), $Si_3N_4$ (silicon nitride), metal having an outer peripheral surface on which an insulation layer is formed, and the like.

A plurality of heat dissipation-side electrodes 2a are formed by plating or the like on an element mount surface (upper surface) of heat dissipation-side substrate 1a. P-type thermoelectric conversion element 3a and n-type thermoelectric conversion element 3b each made of a BiTe-based material are mounted on each of independent heat dissipation-side electrodes 2a. Thereby, p-type thermoelectric conversion element 3a and n-type thermoelectric conversion element 3b are electrically connected to heat dissipation-side electrode 2a.

A plurality of cooling-side electrodes 2b are formed by plating or the like also on the element mount surface (lower surface) of cooling-side substrate 1b. P-type thermoelectric conversion element 3a and n-type thermoelectric conversion element 3b each made of a BiTe-based material are mounted on each of independent cooling-side electrodes 2b. Thereby, p-type thermoelectric conversion element 3a and n-type thermoelectric conversion element 3b are electrically connected to cooling-side electrode 2b.

Heat dissipation-side electrode 2a is displaced relative to cooling-side electrode 2b. Consequently, p-type thermoelectric conversion elements 3a and n-type thermoelectric conversion elements 3b, which are joined between heat dissipation-side electrode 2a and cooling-side electrode 2b, are electrically connected alternately in series.

In addition, a metallization layer 2c for allowing junction with a heat dissipating object is formed on the back surface of the element mount surface (lower surface) of heat dissipation-side substrate 1a. Metallization layers 2d for allowing junction with a cooled object are formed also on the back surface of the element mount surface (upper surface) of cooling-side substrate 1b.

Furthermore, a first lead wire 30a and a second lead wire 30b, which are used for supplying electric power to Peltier module for laser diode 10, are attached onto the upper surface of heat dissipation-side substrate 1a. Specifically, first lead wire 30a is attached with solder 20 onto heat dissipation-side electrode 2a on which only one p-type thermoelectric conversion element 3a is mounted while second lead wire 30b is attached with solder 20 onto heat dissipation-side electrode 2a on which only one n-type thermoelectric conversion element 3b is mounted. Thereby, first and second lead wires 30a and 30b are electrically connected to heat dissipation-side electrode 2a.

Furthermore, a wire bonding pad (electrode) may be implemented without attaching first and second lead wires 30a and 30b. Furthermore, it is preferable that Pd-containing layer is applied between the Ni-containing layer and the Au layer in the wire bonding pad portion. Thereby, diffusion of Ni under a high temperature environment can be prevented, so that deterioration in wire bonding performance can be suppressed.

Furthermore, a metal post 40 may be used in place of first and second lead wires 30a and 30b. Metal post 40 is formed of a polygonal column made of metal. In this case, metal post 40 is electrically connected to heat dissipation-side electrode 2a.

Figure 2:
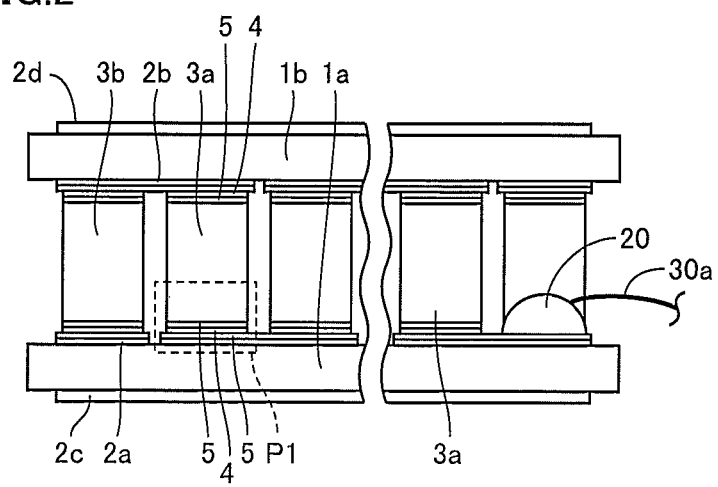
FIG. 2 is an enlarged side view schematically showing the configuration of the Peltier module for laser diode shown in FIG. 1.
Figure 3:
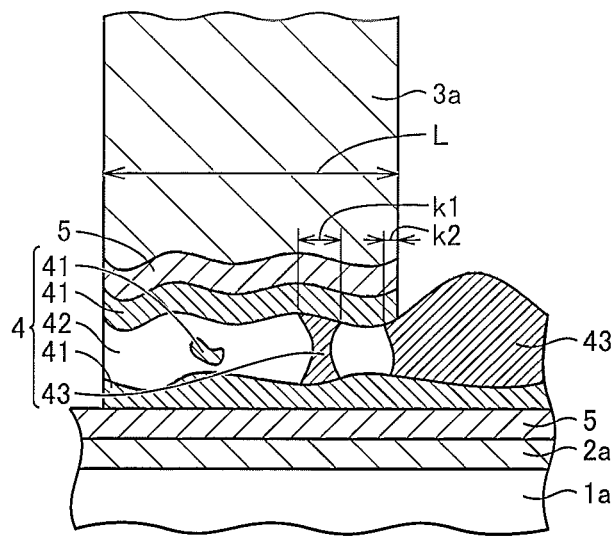
FIG. 3 is enlarged cross-sectional view schematically showing a P1 portion in FIG. 2.

Referring to FIGS. 2 and 3, the configuration of the junction portions between heat dissipation-side and cooling-side electrodes 2a and 2b and p-type and n-type thermoelectric conversion elements 3a and 3b will be hereinafter described in detail. Although the configuration of the junction portion between heat dissipation-side electrode 2a and p-type thermoelectric conversion element 3a will be hereinafter described for the sake of explanation, a similar configuration is provided in each of the junction portion between cooling-side electrode 2b and p-type thermoelectric conversion element 3a, the junction portion between heat dissipation-side electrode 2a and n-type thermoelectric conversion element 3b, and the junction portion between cooling-side electrode 2b and n-type thermoelectric conversion element 3b.

Solder joint layers 4 are disposed between heat dissipation-side electrode 2a and p-type thermoelectric conversion element 3a. Solder joint layer 4 is disposed within a region defined by the bottom surface of heat dissipation-side electrode 2a. Solder joint layer 4 includes: Ni intermetallic compound 41 containing Au and Sn; Au₅Sn intermetallic compound (Au16 at % Sn) 42; and eutectic layers 43 including Au₅Sn intermetallic compound and AuSn intermetallic compound (Au50 at % Sn).

In addition, although eutectic layer 43 exists also outside the region defined by the bottom surface of heat dissipation-side electrode 2a, this eutectic layer 43 does not form solder joint layer 4.

Ni-containing layers 5 are disposed each between solder joint layer 4 and heat dissipation-side electrode 2a and between solder joint layer 4 and p-type thermoelectric conversion element 3a on the heat-dissipation side. Ni-containing layer 5 may be, for example, NiP (nickel phosphorus), NiB (nickel boron), and the like.

The eutectic ratio of solder joint layer 4 is 15.1% or less.

Figure 4:
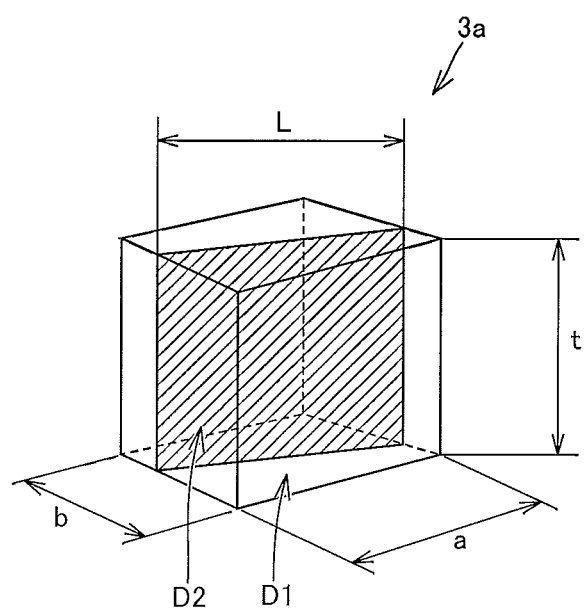
FIG. 4 is a diagram for illustrating a eutectic ratio in the present invention.

Referring to FIG. 4, the eutectic ratio will be hereinafter described. In the case where p-type thermoelectric conversion element 3a has dimensions of a length a, a width b and a height t, length a×width b is assumed to be a solder joint plane D1. With respect to this solder joint plane D1, the element is cut along a perpendicular cutting plane D2 having a junction length L corresponding to a length equal to or greater than the dimensions of length a and width b. A solder cutting plane that appears in this cutting plane D2 is observed, and the maximum length of the eutectic layer in the junction length direction is defined as eutectic lengths k1, k2, . . . , kn. In this case, the eutectic ratio is a value calculated by the following equation (1).

[Equation 1]

$$\text{eutectic ratio} = \frac{\text{total eutectic length}\left(\sum_{i=1}^{n} k_i\right)}{\text{junction length }(L)}[\%] \quad (1)$$

Specifically, in the present embodiment, when p-type thermoelectric conversion element 3a is cut along the entire cutting plane D2, the eutectic ratio of solder joint layer 4 is 15.1% or less. Furthermore, it is preferable that the eutectic ratio of solder joint layer 4 is 10.1% or less.

Furthermore, it is further preferable that the shear strength of solder joint layer 4 is 1.5 N/mm² or more. In this case, the shear strength means the force per unit area applied during measurement depending on the numerical value of shear force (S/F). In addition, the upper limit value of the shear strength of solder joint layer 4 is rate-controlled by the element strength. For example, the upper limit value of the shear strength of solder joint layer 4 is 5 N/mm² or less.

In this Peltier module for laser diode 10, when a direct current flows into p-type thermoelectric conversion element 3a and n-type thermoelectric conversion element 3b through first lead wire 30a and second lead wire 30b, heat dissipation-side substrate 1a is heated while cooling-side substrate 1b is cooled.

Figure 5:
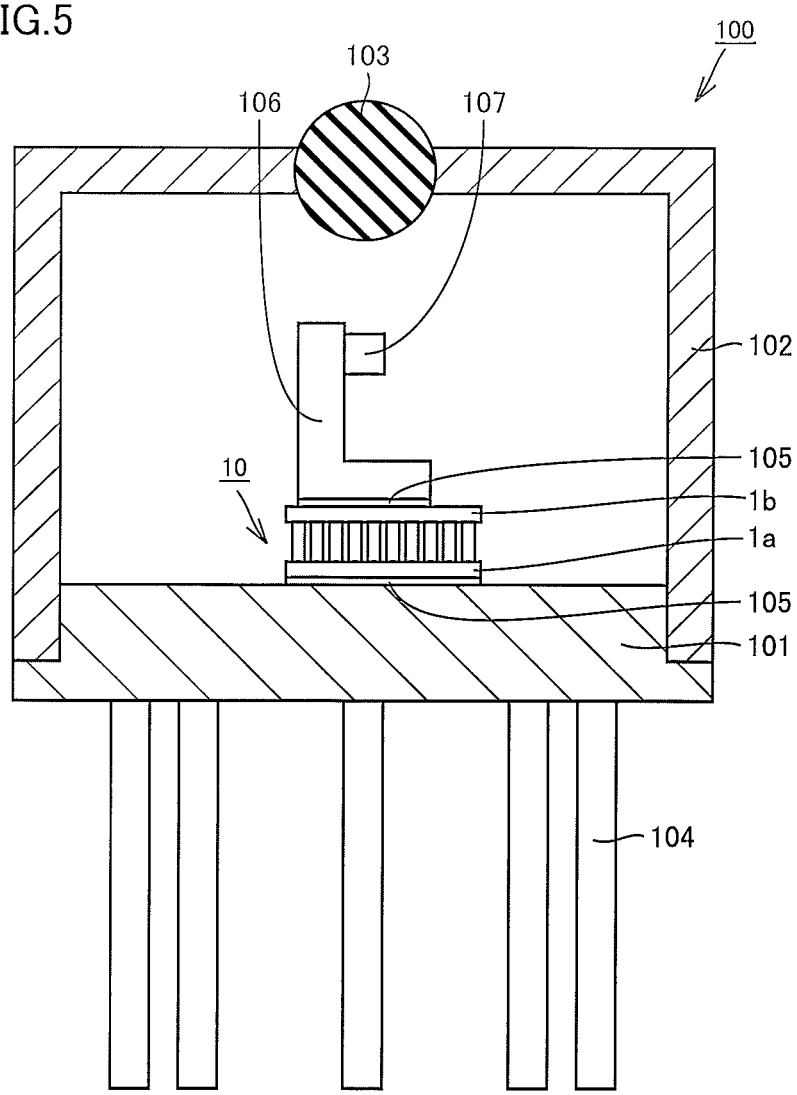
FIG. 5 is a cross-sectional view schematically showing an example of a laser semiconductor module having a Peltier module for laser diode mounted therein according to one embodiment of the present invention.

Then, referring to FIG. 5, an example of a laser semiconductor module 100 having Pettier module for laser diode 10 mounted therein according to one embodiment of the present invention will be hereinafter described. In FIG. 5, Peltier module for laser diode 10 is shown in a simplified manner.

This laser semiconductor module 100 mainly includes a stem 101, a cap 102, a lens 103, a lead pin 104, high melting point solder 105, a submount 106, and a laser diode 107.

Cap 102 is attached to the outer peripheral end of stem 101. Lens 103 is attached to a center portion on the upper surface of cap 102. Lead pin 104 is attached to stem 101 so as to extend from the lower surface in the downward direction. Peltier module for laser diode 10 and the like are disposed within the space surrounded by stem 101, cap 102, and lens 103.

Specifically, heat dissipation-side substrate 1a of Peltier module for laser diode 10 is joined with high melting point solder 105 onto the upper surface of stem 101. This high melting point solder may be AuSn eutectic solder (having a melting point of 280° C.), for example. Submount 106 is joined with high melting point solder 105 onto the upper surface of cooling-side substrate 1b in Peltier module for laser diode 10. Laser diode 107 is attached to the end portion of submount 106. Laser diode 107 is disposed below lens 103.

Laser diode 107 receives electric power from a control unit that is not shown and generates laser light modulated based on prescribed transmission data. This laser light is guided to lens 103, and transmitted toward a prescribed reception circuit.

Furthermore, a thermistor that is not shown is disposed on submount 106. The above-mentioned control unit controls power supply to Peltier module for laser diode 10 based on the temperature detected by this thermistor, thereby controlling the cooling temperature of cooling-side substrate 1b. Accordingly, laser diode 107 is controlled at a target temperature, so that an appropriate oscillation frequency can be maintained.

Figure 6:
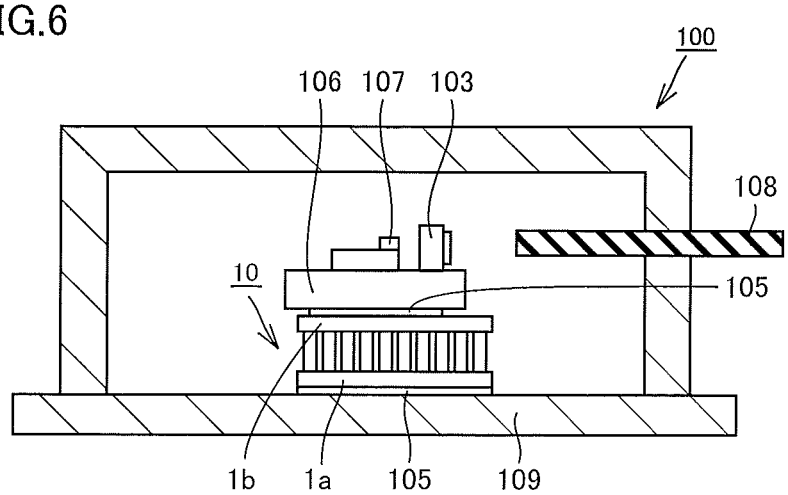
FIG. 6 is a cross-sectional view schematically showing another example of the laser semiconductor module having a Peltier module for laser diode mounted therein according to one embodiment of the present invention.

Also referring to FIG. 6, another example of laser semiconductor module 100 will be hereinafter described. In FIG. 6, Peltier module for laser diode 10 is shown in a simplified manner. Another example of this laser semiconductor module 100 is different mainly from the above-described one example in the point that an optical fiber 108 is provided. In the following description, the same configurations as those in the above-described one example will be designated by the same reference characters unless otherwise specified, and description thereof will not be repeated.

Optical fiber 108 is disposed so as to penetrate the side surface of a package 109 and extend from internal space to external space. Optical fiber 108 faces laser diode 107 across lens 103. Laser light generated from laser diode 107 attached to submount 106 is guided to optical fiber 108 through lens 103. Then, the laser light is transmitted through optical fiber 108 toward a prescribed reception circuit.

Also in another example of this laser semiconductor module 100, power supply to Peltier module for laser diode 10 is controlled based on the temperature detected by the thermistor (not shown) that is disposed on submount 106, thereby controlling the cooling temperature of cooling-side substrate 1b. Accordingly, laser diode 107 is controlled at a target temperature, so that an appropriate oscillation frequency can be maintained.

Then, a method of manufacturing a Peltier module for laser diode in one embodiment of the present invention will be described.

Figure 7:
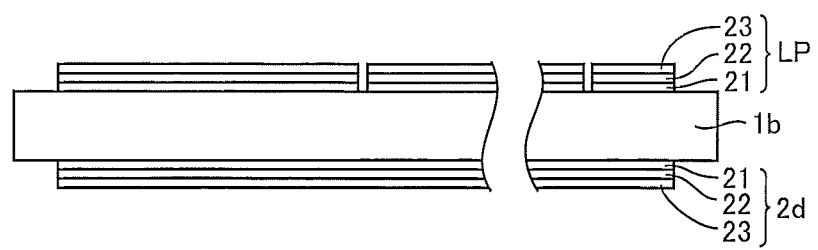
FIG. 7 is a side view schematically showing the configuration of a substrate, which illustrates a method of manufacturing a Peltier module for laser diode in one embodiment of the present invention.

Referring to FIG. 7, cooling-side substrate 1b is prepared. A plurality of land portions LP are formed on an element mount surface (the upper surface in the figure) of cooling-side substrate 1b. In each land portion LP, Cu layers 21, Ni-containing layers 22, and Au layers 23 are formed sequentially in this order from the cooling-side substrate 1b side.

Furthermore, metallization layer 2d is formed on the back surface of the element mount surface (the lower surface in the figure) of cooling-side substrate 1b. Metallization layer 2d is formed on a region that is located slightly inside the outer peripheral portion. Also in metallization layer 2d, Cu layer 21, Ni-containing layer 22, and Au layer 23 are formed sequentially in this order from the cooling-side substrate 1b side. Although not shown, a plurality of land portions LP and metallization layers 2c (see FIG. 1) are similarly formed on the element mount surface and its back surface, respectively, of heat dissipation-side substrate 1a.

Figure 8:
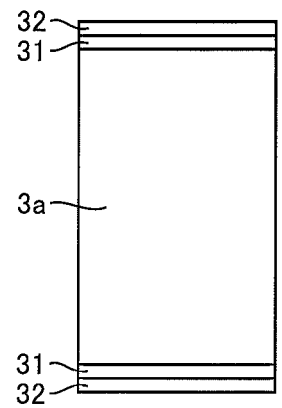
FIG. 8 is a side view schematically showing the configuration of a thermoelectric conversion element, which illustrates the method of manufacturing a Peltier module for laser diode in one embodiment of the present invention.

Furthermore, referring to FIG. 8, p-type thermoelectric conversion element 3a is prepared. On each of the upper and lower surfaces of p-type thermoelectric conversion element 3a, Ni-containing layers 31 and AuSn layers 32 are formed sequentially in this order from the p-type thermoelectric conversion element 3a side. AuSn layer 32 contains 80% by mass of Au and 20% by mass of Sn, for example. Furthermore, although not shown, Ni-containing layer 31 and AuSn layer 32 are similarly formed also on each of the upper and lower surfaces of n-type thermoelectric conversion element 3b.

Figure 9:
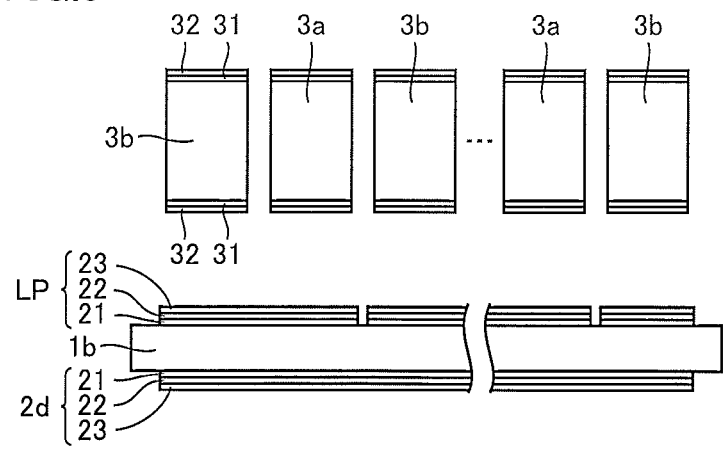
FIG. 9 is a side view schematically showing one step of the method of manufacturing a Peltier module for laser diode in one embodiment of the present invention.
Figure 10:
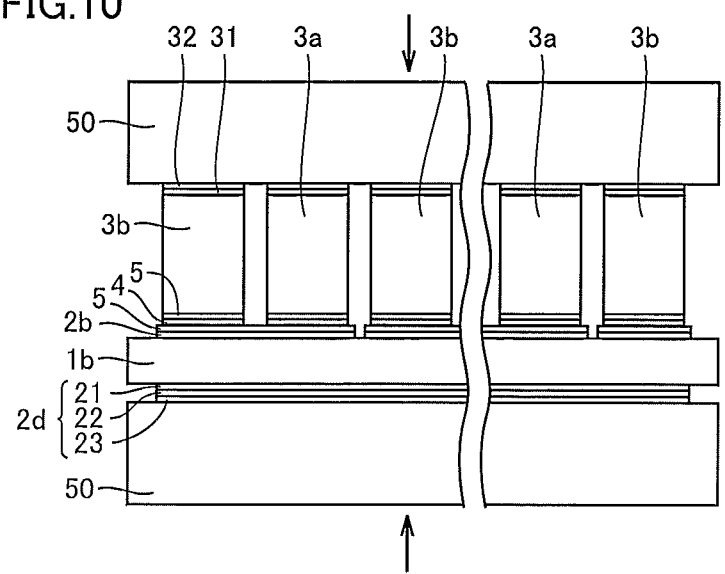
FIG. 10 is a side view schematically showing the step subsequent to that in FIG. 9.

Then, referring to FIGS. 9 and 10, on each land portion LP formed on the element mount surface of cooling-side substrate 1b, p-type thermoelectric conversion element 3a and n-type thermoelectric conversion element 3b are arranged such that Ni-containing layer 31 and AuSn layer 32 formed on one of end faces of each of these thermoelectric conversion elements 3a and 3b face land portion LP.

Then, as indicated by arrows in FIG. 10, cooling-side substrate 1b, p-type thermoelectric conversion element 3a, and n-type thermoelectric conversion element 3b are sandwiched between upper and lower plates 50. While these plates 50 are applying a load, lower plate 50 is heated. Thereby, in a junction portion between cooling-side substrate 1b and each of p-type and n-type thermoelectric conversion elements 3a and 3b, AuSn layer 32 melts when reaching its melting point.

Then, Ni-containing layer 22 in each land portion LP formed on cooling-side substrate 1b; and Ni-containing layer 31 in each of p-type and n-type thermoelectric conversion elements 3a and 3b form Ni-containing layers 5, respectively, that sandwich solder joint layer 4.

Furthermore, solder joint layer 4 is formed by: Ni-containing layer 22 and Au layer 23 in each land portion LP formed on cooling-side substrate 1b; and Ni-containing layer 31 and AuSn layer 32 in each of p-type and n-type thermoelectric conversion elements 3a and 3b. In this case, Au and Sn in AuSn layer 32 that has melted during joining produce intermetallic compound with Ni in each of Ni-containing layer 22 and Ni-containing layer 31. This intermetallic compound is $(Au, Ni)_3Sn_2$, $(Au, Ni)_3Sn$, or the like, in which case Sn is more consumed than Au during compound production. By producing this intermetallic compound, Sn in AuSn layer 32 that has melted during joining is more consumed than Au.

As a result, the proportion of Au in AuSn layer 32 is increased. Accordingly, $Au_5Sn$ intermetallic compound is produced in relatively large amount in solder joint layer 4. Therefore, in solder joint layer 4 including: Ni intermetallic compound containing Au and Sn; $Au_5Sn$ intermetallic compound; and eutectic composition including $Au_5Sn$ intermetallic compound and AuSn intermetallic compound, the proportion of the $Au_5Sn$ intermetallic compound is relatively high. Since this $Au_5Sn$ intermetallic compound is higher in melting temperature than the AuSn eutectic solder, this $Au_5Sn$ intermetallic compound can be suppressed from melting at an elevated temperature as compared with the case of the AuSn eutectic solder.

Furthermore, cooling-side electrode 2b is formed by Cu layer 21 in each land portion LP. In addition, FIG. 10 shows solder joint layer 4, Ni-containing layer 5, and the like in a simplified manner, which is similar in the following figures.

Figure 11:
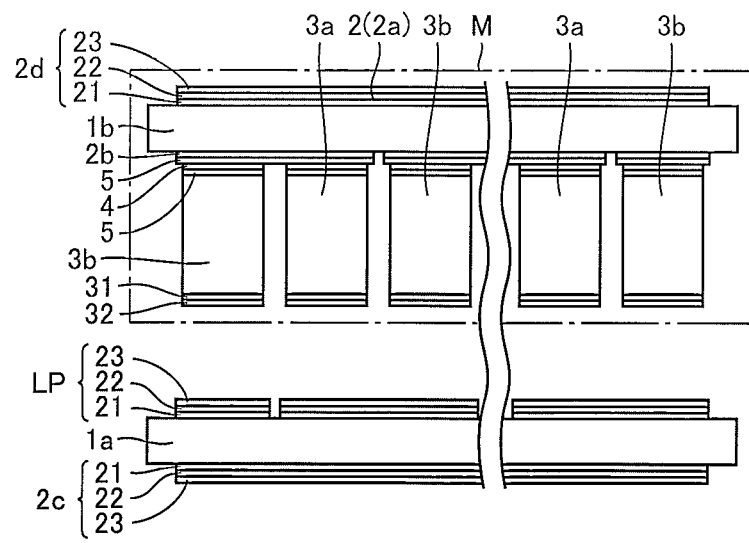
FIG. 11 is a side view schematically showing the step subsequent to that in FIG. 10.
Figure 12:
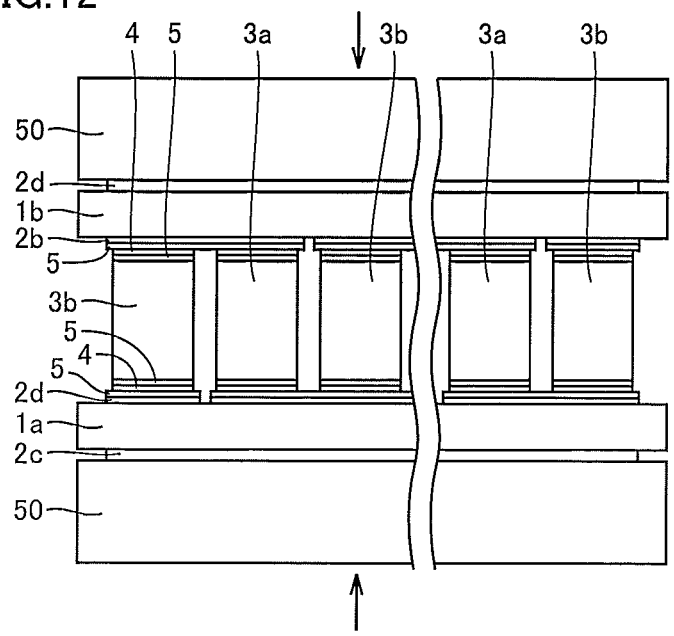
FIG. 12 is a side view schematically showing the step subsequent to that in FIG. 11.

Then, referring to FIGS. 11 and 12, a π assembly module M and heat dissipation-side substrate 1a are prepared. In π assembly module M, only one end face of each of p-type thermoelectric conversion element 3a and n-type thermoelectric conversion element 3b is joined to cooling-side substrate 1b obtained in the above-described step. This π assembly module M is arranged such that Ni-containing layer 31 and AuSn layer 32 formed on the other end face of each of p-type thermoelectric conversion element 3a and n-type thermoelectric conversion element 3b face each land portion LP formed on the element mount surface of heat dissipation-side substrate 1a.

Then, as indicated by arrows in FIG. 12, heat dissipation-side substrate 1a and cooling-side substrate 1b are sandwiched between upper and lower plates 50. In this state, heating is carried out while applying a load to each of these upper and lower plates 50. In this case, heating may be carried out on one plate or both plates. Thereby, in a junction portion between heat dissipation-side substrate 1a and each of p-type and n-type thermoelectric conversion elements 3a and 3b, AuSn layer 32 melts at the time when it reaches its melting point.

Accordingly, as with the above-described cooling-side substrate 1b, Ni-containing layer 22 in each land portion LP formed on heat dissipation-side substrate 1a and Ni-containing layer 31 in each of p-type and n-type thermoelectric conversion elements 3a and 3b form Ni-containing layers 5, respectively, that sandwich solder joint layer 4.

As with the above-described cooling-side substrate 1b, Au and Sn in AuSn layer 32 produce intermetallic compound with Ni in each of Ni-containing layer 22 and Ni-containing layer 31. By producing this intermetallic compound, Sn in AuSn layer 32 having melted during joining is more consumed than Au, so that the proportion of Au in AuSn layer 32 is increased. Consequently, $Au_5Sn$ intermetallic compound is produced in relatively large amount in solder joint layer 4. Accordingly, in this solder joint layer 4 including: Ni intermetallic compound containing Au and Sn; $Au_5Sn$ intermetallic compound; and eutectic composition including $Au_5Sn$ intermetallic compound and AuSn intermetallic compound, the proportion of the $Au_5Sn$ intermetallic compound is relatively high. Furthermore, cooling-side electrode 2b is formed by Cu layer 21 in each land portion LP.

Figure 13:
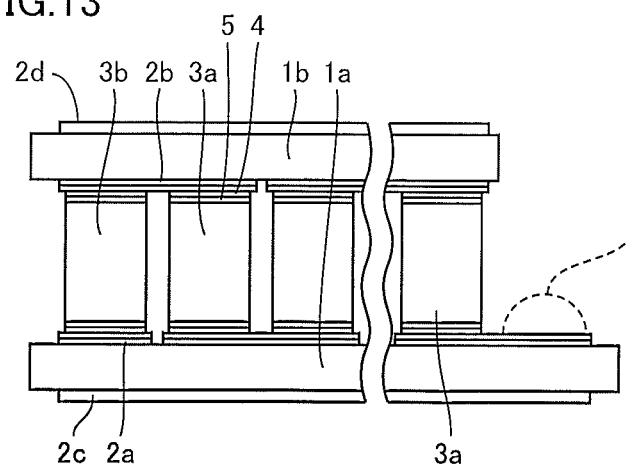
FIG. 13 is a side view of a Peltier module having a wire bonding pad (electrode).

Accordingly, referring to FIG. 13, a Peltier module for laser diode having wire bonding pads (electrode) is manufactured.

Figure 14:
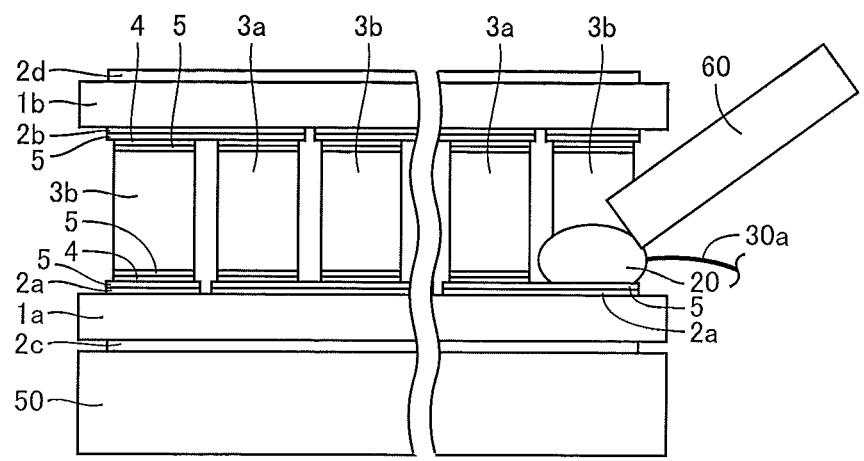
FIG. 14 is a side view schematically showing the step subsequent to that in FIG. 12.
Figure 15:
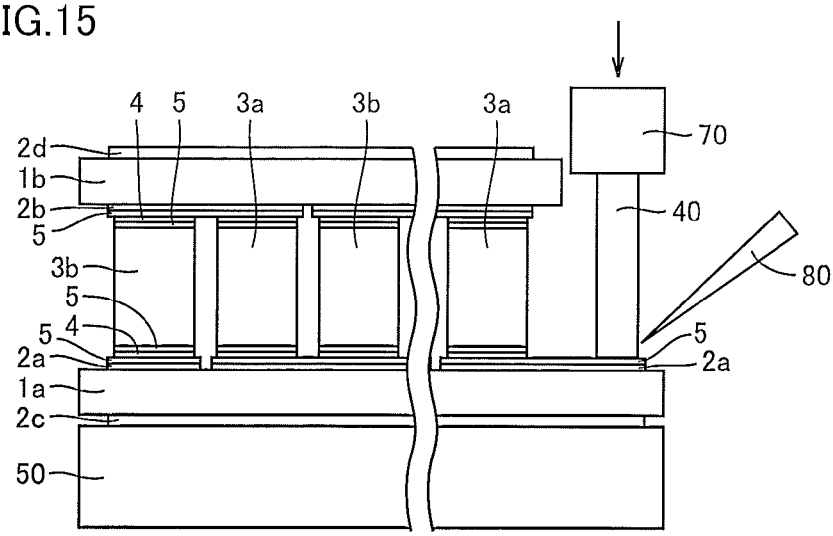
FIG. 15 is a side view schematically showing a modification of the step subsequent to that in FIG. 12.

Then, referring to FIG. 14, first lead wire 30a is joined onto heat dissipation-side electrode 2a with solder 20 that is melted by a soldering iron 60. Referring to FIG. 15, in place of first lead wire 30a, metal post 40 may be joined onto heat dissipation-side electrode 2a. Metal post 40 is heated by laser beam 80 while being applied by a jig 70 with a load as indicated by an arrow in FIG. 15, and thereby joined onto heat dissipation-side electrode 2a. Furthermore, metal post 40 may be joined onto heat dissipation-side electrode 2a while being further heated by plate 50.

In the above description, an explanation has been given with regard to the case where Ni-containing layer 31 and AuSn layer 32 are formed on each of the upper and lower end faces of each of p-type and n-type thermoelectric conversion elements 3a and 3b, but Au layers may be formed in place of AuSn layers 32. In this case, AuSn solder is supplied by cream or pellet.

In the above description, p-type thermoelectric conversion element 3a and n-type thermoelectric conversion element 3b are joined to cooling-side substrate 1b, and thereafter, joined to heat dissipation-side substrate 1a, but may be simultaneously joined to cooling-side substrate 1b and heat dissipation-side substrate 1a.

Then, the functions and effects of the Peltier module for laser diode in one embodiment of the present invention will be hereinafter described.

According to Peltier module for laser diode 10 in one embodiment of the present invention, Ni-containing layer 5 is disposed between solder joint layer 4 and each of heat dissipation-side electrode 2a and cooling-side electrode 2b; and between solder joint layer 4 and each of p-type and n-type thermoelectric conversion elements 3a and 3b. This is because Au and Sn in AuSn layer 32 that has melted during joining form intermetallic compound with Ni in each of Ni-containing layer 22 and Ni-containing layer 31, and this intermetallic compound becomes Ni intermetallic compound 41 containing Au and Sn and serving as a part of solder joint layer 4; and Ni having not contributed to a reaction becomes Ni-containing layers 5. Furthermore, by producing intermetallic compound with Ni, Sn in AuSn layer 32 that has melted during joining is more consumed than Au, so that the proportion of Au in AuSn layer 32 is increased. Consequently, $Au_5Sn$ intermetallic compound is produced in relatively large amount in solder joint layer 4. Accordingly, in solder joint layer 4 including: Ni intermetallic compound containing Au and Sn; $Au_5Sn$ intermetallic compound; and eutectic composition including $Au_5Sn$ intermetallic compound and AuSn intermetallic compound, the proportion of the $Au_5Sn$ intermetallic compound is relatively high. Since this $Au_5Sn$ intermetallic compound is higher in melting point than the AuSn eutectic solder, it does not melt even at a temperature at which the AuSn eutectic solder melts. Therefore, solder joint layer 4 including $Au_5Sn$ intermetallic compound can be suppressed from melting even at an elevated temperature as compared with the case of the AuSn eutectic solder.

Furthermore, the present inventors have found that the eutectic ratio of solder joint layer 4 exerts an influence upon melting of solder joint layer 4. Specifically, the present inventors have found that melting of solder joint layer 4 can be suppressed at a temperature of 320° C. when the eutectic ratio of solder joint layer 4 is 15.1% or less. Then, the present inventors have learned that Peltier module for laser diode 10 can be mounted at an elevated temperature since melting of solder joint layer 4 can be suppressed at a temperature of 320° C.

According to Peltier module for laser diode 10 in one embodiment of the present invention, it is further preferable that the eutectic ratio of the solder joint layer is 10.1% or less. The present inventors have found that melting of solder joint layer 4 can be suppressed at a temperature of 350° C. when the eutectic ratio of solder joint layer 4 is 10.1% or less. Then, the present inventors have learned that Peltier module for laser diode 10 can be mounted at a further elevated temperature since melting of solder joint layer 4 can be suppressed at a temperature of 350° C.

According to Peltier module for laser diode 10 in one embodiment of the present invention, the shear strength of solder joint layer 4 is 1.5 $N/mm^2$ or more. The present inventors have found that melting of solder joint layer 4 can be suppressed when the shear strength of solder joint layer 4 is 1.5 $N/mm^2$ or more.

Peltier module for laser diode 10 in one embodiment of the present invention includes heat dissipation-side electrode 2a as wire bonding pads (electrode). Accordingly, Peltier module for laser diode 10 including first and second wire bonding pads (electrode) can be provided.

Peltier module for laser diode 10 in one embodiment of the present invention further includes first and second lead wires 30a and 30b electrically connected to heat dissipation-side electrode 2a. Accordingly, Peltier module for laser diode 10 including first and second lead wires 30a and 30b can be provided.

Peltier module for laser diode 10 in one embodiment of the present invention further includes metal post 40 electrically connected to heat dissipation-side electrode 2a. Accordingly, Peltier module for laser diode 10 including metal post 40 can be provided.

Figure 19:
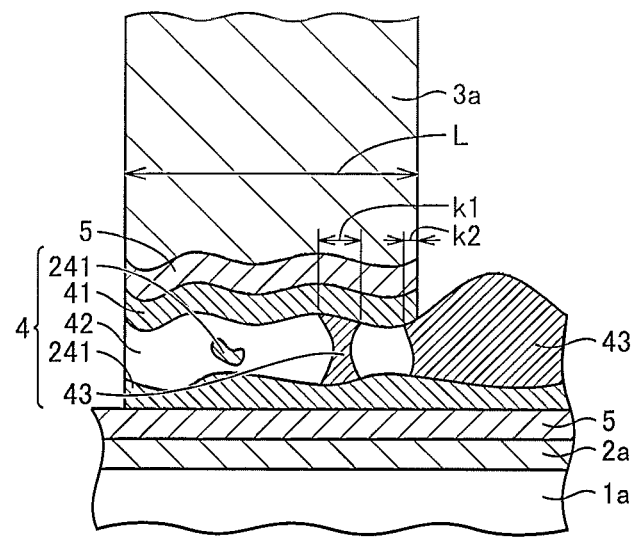
FIG. 19 is a cross-sectional view schematically showing the first example of the configuration in which the solder joint layer contains palladium.
Figure 20:
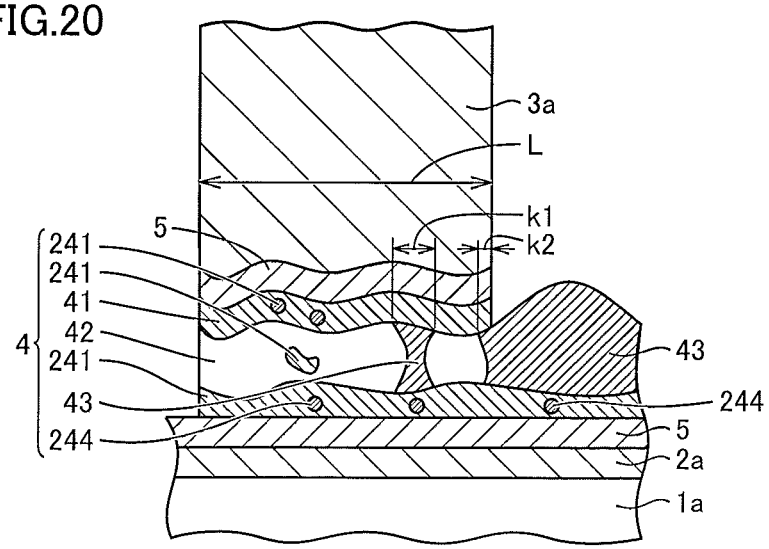
FIG. 20 is a cross-sectional view schematically showing the second example of the configuration in which the solder joint layer contains palladium.
Figure 21:
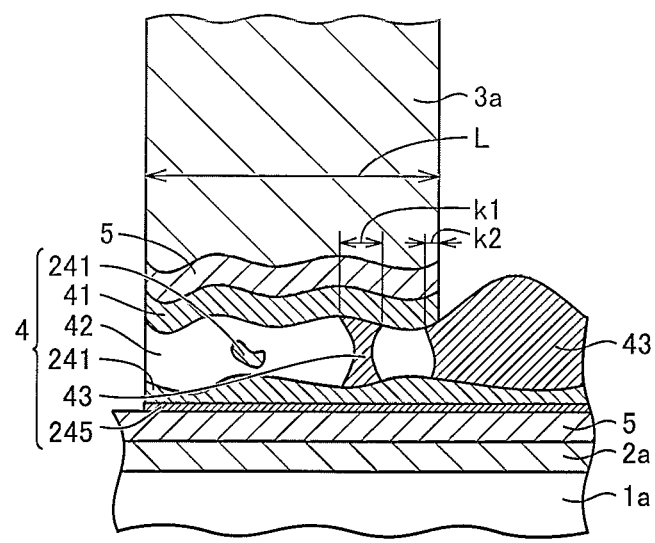
FIG. 21 is a cross-sectional view schematically showing the third example of the configuration in which the solder joint layer contains palladium.

Referring to FIGS. 19, 20 and 21, another example of the configuration of solder joint layer 4 between heat dissipation-side electrode 2a and p-type thermoelectric conversion element 3a will be hereinafter described. While the configuration of the junction portion between heat dissipation-side electrode 2a and p-type thermoelectric conversion element 3a will be described in the following, the similar configuration is provided in each of: the junction portion between cooling-side electrode 2b and p-type thermoelectric conversion element 3a; the junction portion between heat dissipation-side electrode 2a and n-type thermoelectric conversion element 3b; and the junction portion between cooling-side electrode 2b and n-type thermoelectric conversion element 3b.

Solder joint layer 4 may contain palladium (Pd). In the case where solder joint layer 4 does not contain Pd, when Peltier module for laser diode 10 is exposed to an elevated temperature for a long period of time, Ni is diffused onto an electrode surface, which may impair the ease of joining during wire bonding for connecting a wiring line to an electrode. By providing a configuration in which solder joint layer 4 contains Pd, Ni can be suppressed from being diffused onto the electrode surface under a high temperature environment, so that deterioration in the wire bonding performance can be suppressed. Consequently, the wire bonding performance can be improved.

Pd may be contained in the layer corresponding to Ni intermetallic compound 41 shown in FIG. 3. In this case, as shown in FIG. 19, Ni—Pd intermetallic compound 241 containing Au and Sn may be formed as an alternative to Ni intermetallic compound 41 containing Au and Sn shown in FIG. 3. Solder joint layer 4 may be configured to have: Ni intermetallic compound 41 containing Au and Sn; Au$_5$Sn intermetallic compound 42; eutectic layer 43; and Ni—Pd intermetallic compound 241 containing Au and Sn.

Alternatively, as shown in FIG. 20, Pd intermetallic compound 244 containing Au and Sn may be dispersed in layers of Ni—Pd intermetallic compound 241 containing Au and Sn while Ni—Pd intermetallic compound 241 containing Au and Sn may be dispersed in layers of Ni intermetallic compound 41 containing Au and Sn. Solder joint layer 4 may be configured to have: Ni intermetallic compound 41 containing Au and Sn; Au$_5$Sn intermetallic compound 42; eutectic layer 43; Ni—Pd intermetallic compound 241 containing Au and Sn; and Pd intermetallic compound 244 containing Au and Sn.

Alternatively, as shown in FIG. 21, Pd-containing layer 245 may be disposed between Ni-containing layer 5 and Ni—Pd intermetallic compound 241 containing Au and Sn. In other words, Pd-containing layer 245 may be formed on the surface of Ni—Pd intermetallic compound 241 containing Au and Sn as another layer separated from Ni—Pd intermetallic compound 241 containing Au and Sn. Solder joint layer 4 may have Ni intermetallic compound 41 containing Au and Sn; Au$_5$Sn intermetallic compound 42; eutectic layer 43; Ni—Pd intermetallic compound 241 containing Au and Sn; and Pd-containing layer 245.

Figure 22:
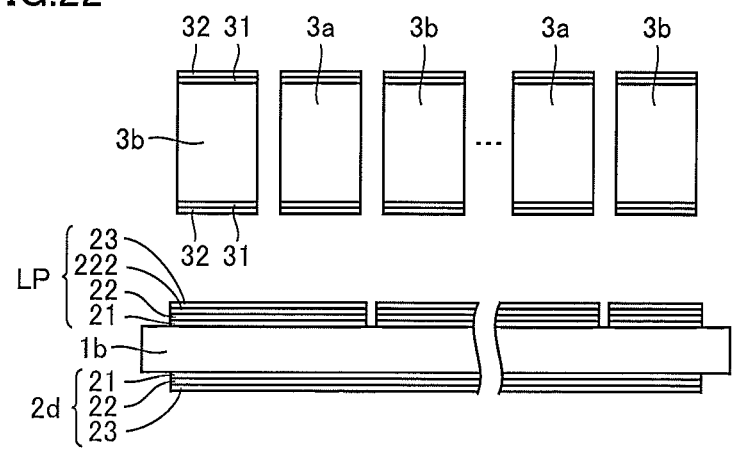
FIG. 22 is a side view schematically showing one step of a method of manufacturing a Peltier module for laser diode in which the solder joint layer contains palladium.
Figure 23:
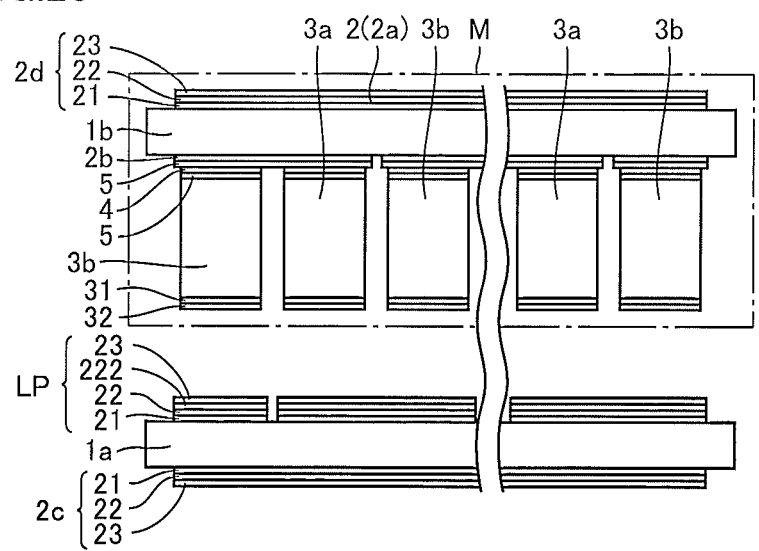
FIG. 23 is a side view schematically showing one step of the method of manufacturing a Peltier module for laser diode in which the solder joint layer contains palladium.

When manufacturing Peltier module for laser diode 10 in which solder joint layer 4 contains Pd as shown in FIG. 19, 20, or 21, land portion LP including Pd-containing layer 222 is formed on the element mount surface of cooling-side substrate 1b. Specifically, as shown in FIG. 22, Cu layer 21, Ni-containing layer 22, Pd-containing layer 222, and Au layer 23 are stacked sequentially in this order from the cooling-side substrate 1b side, to thereby form land portion LP. Land portion LP including Pd-containing layer 222 is similarly formed also on the element mount surface of heat dissipation-side substrate 1a. Specifically, as shown in FIG. 23, Cu layer 21, Ni-containing layer 22, Pd-containing layer 222, and Au layer 23 are stacked sequentially in this order from the heat dissipation-side substrate 1a side, to thereby form land portion LP. In FIGS. 22 and 23, Pd-containing layer 222 may be included in each of metallization layers 2d and 2c.

As having been described with reference to FIGS. 10 and 12, plate 50 is heated in the state where p-type thermoelectric conversion element 3a and n-type thermoelectric conversion element 3b are arranged to face land portion LP, thereby melting AuSn layer 32. Consequently, the configuration in which solder joint layer 4 contains Pd as shown in FIG. 19, 20, or 21 can be realized.

EXAMPLES

Examples of the present invention will be hereinafter described.

In the present examples, a share force (S/F) strength test for each of present inventive examples and comparative examples were performed, and the results were converted into shear strength that is the force per unit area.

First, a method of manufacturing each of the present inventive examples and the comparative examples will be hereinafter described. One thermoelectric conversion element made of a BiTe-based material was prepared. On each of the upper and lower surfaces of this thermoelectric conversion element, Ni layers and AuSn layers were formed sequentially from each element surface side. This AuSn layer contains approximately 80% by mass of Au and approximately 20% by mass of Sn.

Furthermore, two substrates were prepared so as to sandwich the thermoelectric conversion element from above and below. A land portion and metallization layer were formed on the upper surface and the lower surface, respectively, of each of these two substrates. The land portion and the metallization layer each have Cu layers, Ni layers and Au layers arranged sequentially from the substrate side, or Cu layers, Ni layers, Pd layers, and Au layers arranged sequentially from the substrate side.

Then, a thermoelectric conversion element was arranged so as to be sandwiched at its upper and lower end faces by the land portions of these two substrates. Then, two plates were arranged so as to sandwich these two substrates from above and below. These two plates were pressed by means of a spring, thereby applying a load to these two substrates.

Then, two heaters heated at a prescribed temperature came into contact with these two plates from above and below. The heat from these two heaters was transmitted through the two plates to the substrates, thereby causing soldering to occur in the solder joint layer.

These two heaters were separated from two plates after a prescribed time period. Then, after the solder joint layer was sufficiently cooled, these two plates were separated from the substrates. The present inventive examples and the comparative examples each were manufactured by the above-described manufacturing method on the conditions shown in each of Tables 1 and 2.

Furthermore, the S/F strength test will be hereinafter explained. A test device mainly includes: a base; a measurement stand extending from the base in the upward direction; a force gage that is movable along the measurement stand in the upward and downward directions; a pin attached to the end of the force gage; a heater supported by the base; and a fixing claw attached to the heater.

Each of the present inventive examples and the comparative examples was fixed to the fixing claw. In other words, two substrates were approximately perpendicularly arranged while thermoelectric conversion elements were arranged approximately in parallel. In this state, the end of the pin was pressed downward against the other one of two substrates. Specifically, the force gage moved down along the measurement stand to thereby cause the pin to move down, and the end of the pin came into contact with the upper end of the other one of the substrates to press this substrate downward. In this case, value was measured when a solder joint portion in each of the present inventive examples and the comparative examples was damaged due to cracking, fissures and the like. Then, each value was divided by the cross-sectional area of the thermoelectric conversion element and converted into force per unit area, which shows the shear strength of the solder joint layer.

Referring to Tables 1 and 2, present inventive examples 1, 2, 3, 4, 5, 7, 8, 9, 11, 12, 13, 15, 16, and 17 are examples of the present invention. Comparative examples 6, 10, and 14 are comparative examples for the present invention. In present inventive example 17, solder joint layer 4 contains Pd.

TABLE 1

|  |  | present inventive example 1 | present inventive example 2 | present inventive example 3 | present inventive example 4 | present inventive example 5 | comparative example 6 | present inventive example 7 | present inventive example 8 |
|---|---|---|---|---|---|---|---|---|---|
| Total cross-sectional area of element (mm²) | | 0.81 | 0.20 | 0.20 | 0.20 | 0.20 | 0.81 | 0.20 | 0.20 |
| Supplied solder thickness (μm) | | 5 | 5 | 5 | 10 | 10 | 10 | 10 | 10 |
| Temperature (° C.) | | 390 | 390 | 390 | 370 | 390 | 390 | 390 | 390 |
| Time (second) | | 60 | 60 | 60 | 60 | 30 | 60 | 60 | 60 |
| Pressure for assembly (MPa) | | 1.2 | 4.9 | 9.9 | 19.8 | 19.8 | 1.2 | 9.9 | 19.8 |
| Shear strength (N/mm²) | 350° C. | 3.0 | 2.0 | 2.2 | 0.0 | 0.0 | 0.0 | 0.0 | 1.9 |
|  | 320° C. | 3.2 | 2.4 | 2.5 | 2.4 | 2.2 | 0.0 | 2.0 | 2.4 |
| Determination of mountable temperature | 350° C. | ○ | ○ | ○ | x | x | x | x | ○ |
|  | 320° C. | ○ | ○ | ○ | ○ | ○ | x | ○ | ○ |
| Solder joint thickness (μm) | | 3.7 | 2.1 | 1.7 | 4.7 | 4.4 | 9.1 | 4.6 | 2.5 |
| Eutectic ratio (%) | | 1.3 | 8.8 | 7.6 | 10.2 | 10.4 | 30.3 | 12.1 | 7.9 |

|  |  | present inventive example 9 | comparative example 10 | present inventive example 11 | present inventive example 12 | present inventive example 13 | comparative example 14 | present inventive example 15 | present inventive example 16 |
|---|---|---|---|---|---|---|---|---|---|
| Total cross-sectional area of element (mm²) | | 0.20 | 0.81 | 0.20 | 0.20 | 0.20 | 0.81 | 0.20 | 0.20 |
| Supplied solder thickness (μm) | | 10 | 15 | 15 | 15 | 15 | 20 | 20 | 20 |
| Temperature (° C.) | | 390 | 390 | 390 | 390 | 390 | 390 | 390 | 390 |
| Time (second) | | 60 | 60 | 60 | 60 | 60 | 60 | 60 | 60 |
| Pressure for assembly (MPa) | | 29.6 | 1.2 | 19.8 | 29.6 | 39.5 | 1.2 | 29.6 | 39.5 |
| Shear strength (N/mm²) | 350° C. | 1.9 | 0.0 | 0.0 | 2.2 | 1.5 | 0.0 | 0.0 | 1.7 |
|  | 320° C. | 2.2 | 0.0 | 1.9 | 2.5 | 2.3 | 0.0 | 2.0 | 2.3 |
| Determination of mountable temperature | 350° C. | ○ | x | x | ○ | ○ | x | x | ○ |
|  | 320° C. | ○ | x | ○ | ○ | ○ | x | ○ | ○ |
| Solder joint thickness (μm) | | 3.6 | 12.6 | 4.4 | 2.9 | 2.5 | 14.0 | 7.0 | 2.9 |
| Eutectic ratio (%) | | 10.1 | 58.1 | 12.8 | 8.3 | 5.0 | 24.1 | 15.1 | 9.1 |

TABLE 2

|  |  | present inventive example 17 |
|---|---|---|
| Total cross-sectional area of element (mm²) | | 2.07 |
| Supplied solder thickness (μm) | | 10 |
| Temperature (° C.) | | 390 |
| Time (second) | | 120 |
| Pressure for assembly (MPa) | | 0.5 |
| Shear strength (N/mm²) | 350° C. | 4.1 |
|  | 320° C. | 6.0 |
| Determination of mountable temperature | 350° C. | ○ |
|  | 320° C. | ○ |
| Solder joint thickness (μm) | | 5.6 |
| Eutectic ratio (%) | | 7.9 |

Each item in Tables 1 and 2 will be explained. Element cross-sectional area (mm²) shows a cross-sectional area of a thermoelectric conversion element taken along the plane perpendicular to the vertical direction. This element cross-sectional area corresponds to an area of the end face on which AuSn layers are formed. Supplied solder thickness (μm) shows a thickness of the AuSn layer formed on the Ni layer. Temperature (° C.) shows a set temperature of the heater of a manufacturing device in each of the present inventive examples and the comparative examples. Time (second) shows time during which a plate is in contact with the heated heater. Pressure for assembly (MPa) shows a pressure by which a plate is weighted by means of a spring.

Shear strength (N/mm²) shows a value that is obtained by standardizing the value obtained in the S/F strength test (N) to force per unit area. The S/F strength test was carried out at 320° C. and 350° C. These temperatures correspond to temperatures of the heater in the S/F strength test device, and are identical to the temperatures of the solder joint layer. Determination of a mountable temperature shows whether a Peltier module for laser diode is mountable or not. The determination of a mountable temperature was made each at 320° C. and 350° C. Solder joint thickness (μm) shows the maximum thickness of the solder joint layer in the state where the thermoelectric conversion element and the electrode were joined. Eutectic ratio (%) shows the value explained as in the above description.

In Table 1, a value 0.0 (N/mm²) in the column of the shear strength shows that S/F strength could not be measured since the solder joint layer melted. Furthermore, in Table, 1, a symbol o in the column of determination of mountable temperature shows that it was determined that a Peltier module for laser diode is mountable since the S/F strength could be measured. Also, a symbol x in this column shows that it was determined that a Peltier module for laser diode is not mountable since the S/F strength could not be measured due to melting of the solder joint layer.

Figure 16:
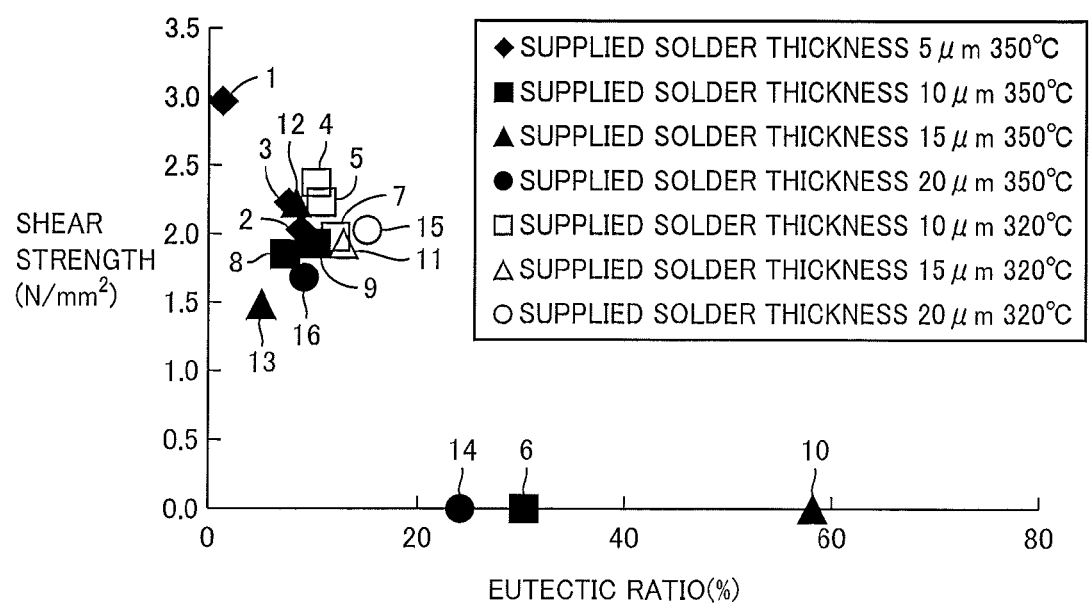
FIG. 16 is a diagram showing the relation between the shear strength and the eutectic ratio in each example.

Referring to Tables 1 and 2 and FIG. 16, in present inventive examples 1, 2, 3, 4, 5, 7, 8, 9, 11, 12, 13, 15, 16, and 17, the S/F strength could be measured at 320° C. or 350° C. Accordingly, it turned out that a Peltier module for laser diode is mountable at 320° C. or 350° C. in present inventive examples 1, 2, 3, 4, 5, 7, 8, 9, 11, 12, 13, 15, 16, and 17. Therefore, it turned out that melting of the solder joint layer can be suppressed at 320° C. or 350° C. in present inventive examples 1, 2, 3, 4, 5, 7, 8, 9, 11, 12, 13, 15, 16, and 17. In addition, the S/F strength could not be measured at 320° C. and 350° C. in comparative examples 6, 10, and 14.

When comparing the present inventive examples and the comparative examples, it turned out that the values of the eutectic ratios are significantly different therebetween. Consequently, the present inventors have found that the eutectic ratio of the solder joint layer exerts an influence upon melting of the solder joint layer. In addition, among the present inventive examples, present inventive example 15 shows the largest eutectic ratio, which was 15.1%. Accordingly, the present inventors have found that melting of the solder joint layer can be suppressed at a temperature of 320 CC when the eutectic ratio of the solder joint layer is 15.1% or less.

Furthermore, in present inventive examples 1, 2, 3, 8, 9, 12, 13, 16, and 17 among the present inventive examples, the S/F strength could be measured at a temperature of 350° C. Among them, present inventive example 9 shows the largest eutectic ratio, which was 10.1%. Consequently, the present inventors have found that melting of the solder joint layer can be suppressed at a temperature of 350° C. when the eutectic ratio of the solder joint layer is 10.1% or less.

Furthermore, when paying attention to the shear strength in each of present inventive examples 1, 2, 3, 8, 9, 12, 13, 16, and 17 in which the S/F strength could be measured at a temperature of 350° C., present inventive example 13 showed the smallest value. This shear strength in present inventive example 13 was 1.5 N/mm². Based on this result, the present inventors have found that melting of the solder joint layer can be suppressed when the shear strength of the solder joint layer is 1.5 N/mm² or more.

Figure 17:
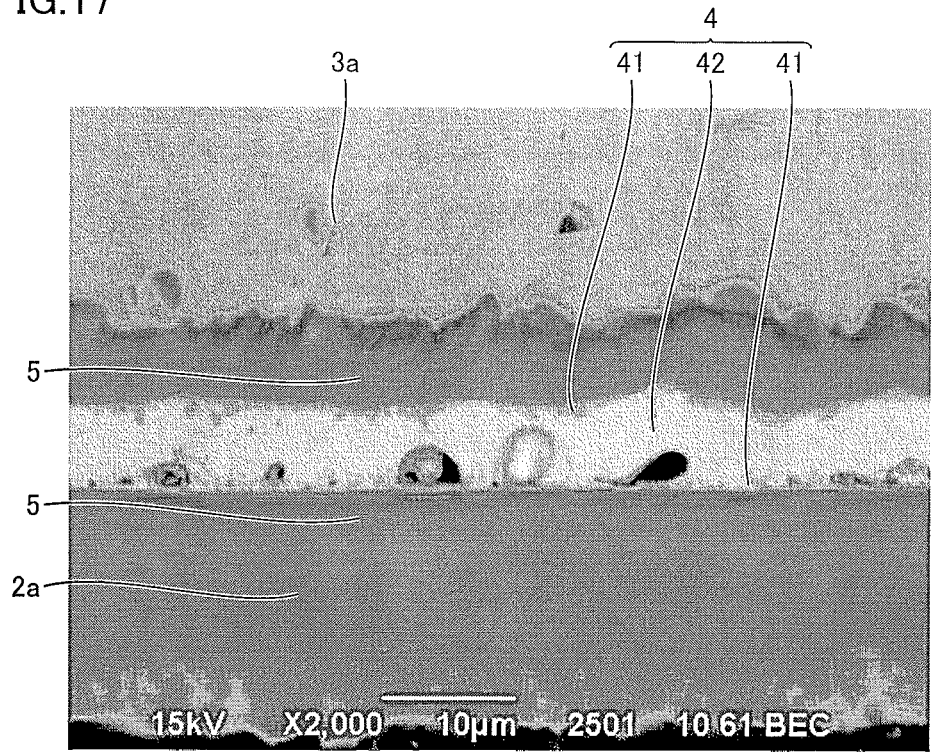
FIG. 17 is an SEM (scanning electron microscope) photograph showing an area around solder joint layers of the Peltier module where shear strength is measured at 350° C.
Figure 18:
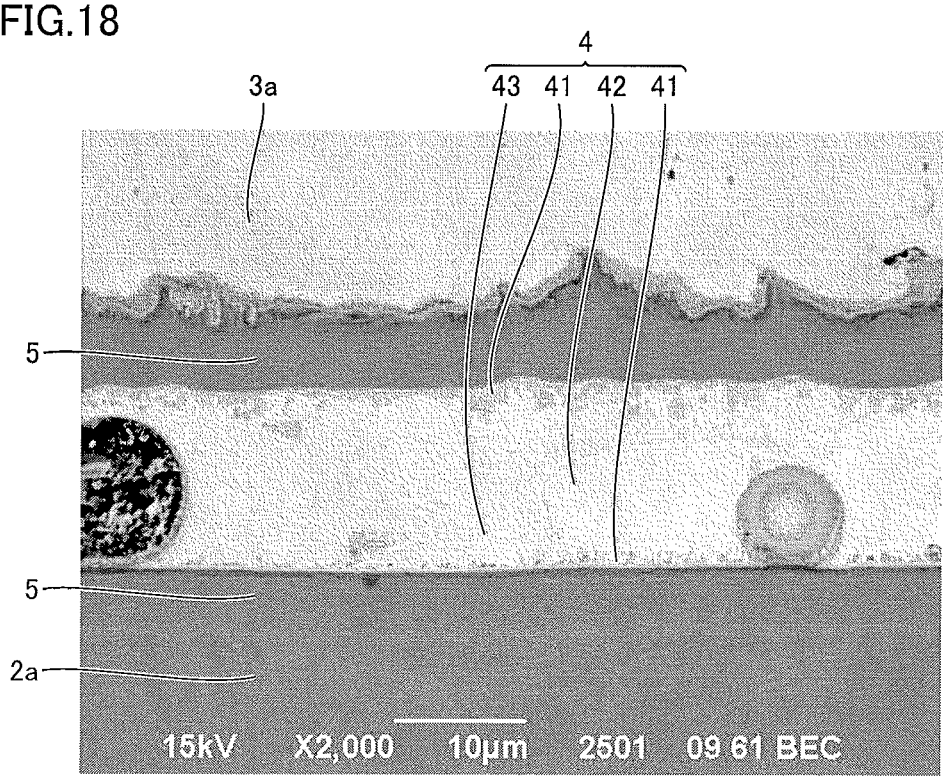
FIG. 18 is an SEM (scanning electron microscope) photograph showing an area around solder joint layers in an example of the Pettier module where solder melts at 280° C. that is a melting point of AuSn eutectic solder.

Furthermore, as an example of the present invention, FIG. 17 shows an SEM. (scanning electron microscope) photograph showing an area around the solder joint layer of a Peltier module where the shear strength was measured at 350° C. As a comparative example, FIG. 18 shows an SEM (scanning electron microscope) photograph showing an area around the solder joint layer of an example of the Peltier module in which solder melts at 280° C. that is a melting point of AuSn eutectic solder.

It should be understood that the embodiments and examples disclosed herein are illustrative and non-restrictive in every respect. The scope of the present invention is defined by the terms of the claims, rather than the description above, and is intended to include any modifications within the meaning and scope equivalent to the terms of the claims.

INDUSTRIAL APPLICABILITY

The present invention may be particularly advantageously applied to a Peltier module for laser diode in which a thermoelectric conversion element is disposed on an electrode of a substrate with a solder joint layer interposed therebetween.

REFERENCE SIGNS LIST 1a heat dissipation-side substrate, 1b cooling-side substrate, 2a heat dissipation-side electrode, 2b cooling-side electrode, 2c, 2d metallization layer, 3a p-type thermoelectric conversion element, 3b n-type thermoelectric conversion element, 4 solder joint layer, 5 Ni-containing layer, 10 Peltier module for laser diode, 20 solder, 21 Cu Layer, 22 Ni-containing layer, 23 Au layer, 30a first lead wire, 30b second lead wire, 31 Ni-containing layer, 32 AuSn layer, 40 metal post, 41 Ni intermetallic compound containing Au and Sn, 42 Au$_5$Sn intermetallic compound, 43 AuSn eutectic layer, 50 plate, 60 soldering iron, 70 jig, 80 laser beam, 0.100 laser semiconductor module, 101 stem, 102 cap, 103 lens, 104 lead pin, 105 high melting point solder, 106 submount, 107 laser diode, 108 optical fiber, 109 package, 222 Pd-containing layer, 241 Ni—Pd intermetallic compound containing Au and Sn, 244 Pd intermetallic compound containing Au and Sn, 245 Pd-containing layer, D1 solder joint plane, D2 cutting plane, L junction length, LP land portion, M π assembly module.

The invention claimed is:

1. A Peltier module for laser diode, comprising a thermoelectric conversion module for performing conversion between heat and electricity, p-type BiTe-based thermoelectric conversion elements and n-type BiTe-based thermoelectric conversion elements each having an upper surface and a lower surface, Ni-containing layers being formed on each of said upper surface and said lower surface, electrodes being formed on an insulation support substrate that is disposed above and below each of said p-type and n-type BiTe-based thermoelectric conversion elements, said electrode having a surface on which Ni-containing layers are formed, each of said p-type and n-type BiTe-based thermoelectric conversion elements and said electrode being electrically and thermally joined by a solder joint layer, said solder joint layer including: Ni intermetallic compound containing Au and Sn; Au$_5$Sn intermetallic compound; and eutectic layers including both Au$_5$Sn intermetallic compound and AuSn intermetallic compound that are adjacent to the Ni-containing layer in each of said p-type and n-type BiTe-based thermoelectric conversion elements and said electrode, and said solder joint layer having a eutectic ratio of 15.1% or less.

2. The Peltier module for laser diode according to claim 1, wherein the eutectic ratio of said solder joint layer is 10.1% or less.

3. The Peltier module for laser diode according to claim 1, wherein said solder joint layer has shear strength of 1.5 N/mm² or more.

4. The Peltier module for laser diode according to claim 1, wherein said solder joint layer contains Pd.

5. The Peltier module for laser diode according to claim 1, further comprising wire bonding pads (electrode) electrically connected to said electrode.

6. The Peltier module for laser diode according to claim 1, further comprising lead wires electrically connected to said electrode.

7. The Peltier module for laser diode according to claim 1, further comprising a metal post electrically connected to said electrode.

* * * * *